(12) United States Patent
Giesber, III

(10) Patent No.: US 7,317,859 B2
(45) Date of Patent: Jan. 8, 2008

(54) PERIODICALLY POLED OPTICAL CRYSTALS AND PROCESS FOR THE PRODUCTION THEREOF

(75) Inventor: Henry G. Giesber, III, Charlotte, NC (US)

(73) Assignee: Advanced Photonics Crystals, Ft. Mill, SC (US)

( * ) Notice: Subject to any disclaimer, the term of this patent is extended or adjusted under 35 U.S.C. 154(b) by 93 days.

(21) Appl. No.: 11/210,590

(22) Filed: Aug. 24, 2005

(65) Prior Publication Data

US 2006/0045455 A1    Mar. 2, 2006

Related U.S. Application Data

(60) Provisional application No. 60/604,620, filed on Aug. 25, 2004.

(51) Int. Cl.
*G02B 6/10* (2006.01)
(52) U.S. Cl. .................. 385/129; 385/130; 385/131
(58) Field of Classification Search ................ 385/129
See application file for complete search history.

(56) References Cited

U.S. PATENT DOCUMENTS

| | | |
|---|---|---|
| 3,440,025 A | 4/1969 | Laudise |
| 4,231,838 A | 11/1980 | Gier |
| 4,305,778 A | 12/1981 | Gier |
| 4,654,111 A | 3/1987 | Laudise |
| 4,746,396 A | 5/1988 | Marnier |
| 4,761,202 A | 8/1988 | Bordui et al. |
| 4,961,819 A | 10/1990 | Marnier |
| 4,997,515 A | 3/1991 | Ohbayashi |
| 5,066,356 A | 11/1991 | Ferretti et al. |
| 5,084,206 A | 1/1992 | Ballman et al. |
| 5,193,023 A | 3/1993 | Yamada et al. |
| 5,264,073 A | 11/1993 | Cheng |
| 5,322,588 A | 6/1994 | Habu et al. |
| 5,370,076 A | 12/1994 | Okamoto et al. |
| 5,448,125 A | 9/1995 | Chu |
| 5,500,145 A | 3/1996 | Cheng |
| 5,533,465 A | 7/1996 | Ferretti et al. |
| 5,644,422 A | 7/1997 | Bortz et al. |
| 5,652,674 A | 7/1997 | Mizuuchi et al. |
| 5,654,229 A | 8/1997 | Leplingard et al. |
| 5,788,764 A | 8/1998 | Sato |
| 5,879,590 A | 3/1999 | Blom et al. |
| 6,002,515 A | 12/1999 | Mizuuchi et al. |
| 6,301,273 B1 * | 10/2001 | Sanders et al. ................ 372/6 |
| 6,353,495 B1 | 3/2002 | Mizuuchi et al. |
| 6,542,285 B1 | 4/2003 | Batchko et al. |

OTHER PUBLICATIONS

Feisst et al., "Current Induced Periodic Ferroelectric Domain Structures in LiNbO3 . . . ," Applied Physics Letters vol. 47(11), Dec. 1, 1985, pp. 1125-1127.

(Continued)

*Primary Examiner*—Jennifer Doan
(74) *Attorney, Agent, or Firm*—Leigh P Gregory

(57) ABSTRACT

Periodically poled crystals and a hydrothermal growth method for making such are disclosed. Electronically periodically poled crystals are employed as seed crystals in a hydrothermal growth process in order to produce novel crystals having deep ferroelectric domains.

18 Claims, 1 Drawing Sheet

OTHER PUBLICATIONS

Feng et al., "Enhancement of Second Harmonic Generation in LiNbO3 Crystals . . . ," Applied Physics Letters, vol. 37(1), Oct. 1, 1980, pp. 607-609.

Ito et al., "Fabrication of Periodic Domain Grating in LiNbO3 . . . ," Electronic Letters, vol. 27(14), Jul. 4, 1991, pp. 1221-1222.

Champert et al., "Sum Frequency generation of synchronously-seeded, high-power Yb and Er fiber amplifiers . . . ," Applied Physics Letters, vol. 81(20), Nov. 11, 2002, pp. 3732-3734.

Schwedes et al., "Narrow-bandwith diode-laser-based blue and untraviolet light source," Applied Physics B (76), 2003, pp. 143-147.

Torabi-Goudarzi/Riis, "Efficient cw high-power frequency doubling in periodically poled KTP," Optics Communications 227, 2003, pp. 389-403.

Peltz et al., "Optical parametric oscillators for high pulse energy and high average power operation . . . ," Applied Physics B (73), 2003, pp. 663-670.

Agate et al., "Highly efficient blue-light generation from a compact, diode-pumped femtosecond laser . . . ," Optics Letters, vol. 28(20), Oct. 15, 2003, pp. 1963-1965.

* cited by examiner

PERIODICALLY POLED OPTICAL CRYSTALS AND PROCESS FOR THE PRODUCTION THEREOF

The present application claims the benefit of prior provisional application, U.S. Ser. No. 60/604,620, filed Aug. 25, 2004.

FIELD OF THE INVENTION

The present invention is directed generally to periodically poled crystals and specifically to a hydrothermal growth process for producing such periodically poled crystals.

BACKGROUND OF THE INVENTION

There has been much work directed to providing frequency conversion of the output from presently available laser and laser diode sources to wavelengths not readily available from these sources. The most attractive alternative for frequency conversion, such as frequency doubling, sum frequency generation and difference frequency generation, is quasi-phase matching (QPM) of an input radiation beam or beams from laser or laser diode sources and their harmonic waves in second order optical crystals. Typical second order optical crystals for use in such applications include inorganic crystals such as, for example, $LiNbO_3$, $LiTaO_3$ and KTP. In the case of such crystals, the QPM conditions must be satisfied between the interacting waves in order to achieve efficient nonlinear optical interaction.

QPM allows interactions between lightwaves or radiation polarized such that the nonlinearity is maximized and allows interactions to occur in the crystal for which birefringent phase matching is not possible. Compared to birefringent phase matching, QPM allows both access to new wavelengths and higher conversion efficiencies. Since the refractive index of the crystal is dependent upon wavelength of the light to be converted, it is necessary to provide a periodic inverted domain structure (i.e., periodic poling) within the crystal so as to have domains in the crystal of nonlinear optical coefficient of periodic inverted sign, e.g., two or more regions or domains of different states of ferroelectric polarization transverse to the path of light to be converted. First order QPM requires sign reversals of the effective nonlinear coefficient with a period equal to two coherence lengths. The light waves produced by the nonlinear polarization periodic pattern in the crystal are in phase at the given wavelength so that the waves intensify each other.

To date, one frequency conversion that is highly desirable is that which generates visible light in the "blue" radiation spectrum, such as wavelengths in the range of about 390 nm to 492 nm, which has many applications such is in color display devices, color projectors and color printers.

In practice, the ability to create finely spaced domains with sufficiently accurate periodicity and well defined domain walls in the crystal is a challenging, if not difficult, task to accomplish, particularly on a continuous yield basis. So far, there are presently several ways to form the periodic domain pattern of desired spontaneous polarization in the nonlinear crystal, i.e., processing regions or domains having a ferroelectric polarization direction that is dominant over all other possible directions. These several ways may be classified, in part, as (1) inverted domain patterns of differing composition, i.e., by surface impurity diffusion or by ion exchange, (2) inverted domain patterns of same composition, i.e., electric field treatment with or without heat, (3) inverted domains through periodic modulation during crystal growth, i.e., current bias or temperature fluctuation treatment during crystal growth (e.g., by a modified Czochralski process) and (4) electron beam treatment.

KTP is poled most typically by an ion exchange process within the first classification. A chromium mask is evaporated onto the surface of the crystal. Looking through the mask is somewhat like looking through a black, plastic comb, with the teeth of the comb representing the presence of chromium. The masked crystal is placed in a melt of $BaNO_3$ or $RbNO_3$. Exchange of Ba or Rb for the K in the KTP occurs only where the chromium is absent; the chromium blocks the exchange where it is present. The mask is then removed. The resultant, periodic stripes where ion exchange has occurred have a different index of refraction than the pure KTP stripes.

The second type of classification is generally achieved by the application of a high voltage, electric field through the employment of a pattern of electrodes formed on one major surface of the crystal with a planar electrode formed on the opposite major surface of the crystal forming the opposing field electrode. The applied field is either pulsed or a continuous wave for a short period of time and is generally accompanied with an applied temperature such as above 100° C. The permanent inversion of the domains is accomplished by means of minute changes in ions in the unit lattice of the crystal due to the application of the electric field. By "permanent", what is meant is that the inverted domain pattern will remain as long as the crystal is not subsequently reheated to high temperature near the Curie temperature of the crystal or subjected to any further high voltage fields.

In about 1963, R. C. Miller recognized that inverted domains could be formed in ferroelectric crystals by cycling an applied electric field to switch the spontaneous polarization of the crystal. U.S. Pat. No. 5,193,023 teaches periodic poling, using a pattern of electrodes on one side of a crystal and a planar electrode on the opposite side of the crystal across which an electric field is applied. In the examples of U.S. Pat. No. 5,193,023 where an electric field is employed, poling is accomplished in an atmosphere containing oxygen with an applied temperature in the range of 150° C. to 1200° C. and an applied voltage field of several hundreds of volts per centimeter or less. The field inversion in U.S. Pat. No. 5,193,023 is accomplished at relatively lower applied voltages, such as at several hundreds of volts per centimeter (or several kilovolts per centimeter when using pulse voltages) or less, since the crystal is heated to a sufficiently high temperature during the applied E-field process. However, it has been found that higher voltages can be successfully employed at room temperature.

Examples of the third type of classification are, respectively, the articles of A Feisst et al., "Current Induced Periodic Ferroelectric Domain Structures in $LiNbO_3$ Applied for Efficient Nonlinear Optical Frequency Mixing", Applied Physics Letters, Vol. 47(11), pp. 1125-1127, Dec. 1, 1985 and Duan Feng et al., "Enhancement of Second Harmonic generation in $LiNbO_3$ Crystals With Periodic Laminar Ferroelectric Domains", Applied Physics Letters, Vol. 37(1), pp. 607-609, Oct. 1, 1980. Both of these articles describe crystals grown by flux growth methods at temperatures above the Curie temperature of the crystal.

An example for the fourth type of classification is the article of H. Ito et al., "Fabrication of Periodic Domain Grating in $LiNbO_3$ by Electron Beam Writing for Application of Nonlinear Optical processes", Electronic Letters, Vol. 27(14), pp. 1221-1222, Jul. 4, 1991.

Of all of the foregoing classifications, heretofore the second type of classification has been found the most successful from the standpoint of providing periodic domains that have accurate periodicity and substantially vertically formed domain walls creating the nonlinear periodic waveguide in the crystal. The use of the applied electric field permits the formation of domains that have accurate periodicity and the domains are formed through the crystal forming domain walls that have some parallelism with the z axis of the crystal. However, in the case of the second type as well as all other types classified, the processing only provides for shallow domain structures that do not effectively extend through the crystal bulk and do not form vertical wall boundaries for the formed inverted domains substantially parallel with the z axis of the crystal. What is needed is a process that provides for vertically formed domain walls that extend in the z axis direction through the crystal bulk without walkoff, i.e., capable of providing bulk frequency conversion, forming highly uniform periodicity, laterally extending domain patterns which achieve first order intervals over long crystal interaction lengths. Heretodate, such domain patterns have only extended a maximum of about 3 mm into the crystal depth.

Although not known as a means for producing periodically poled crystals, hydrothermal techniques are an excellent and well known route to high quality single crystals for a variety of electro-optic applications. For example, all electronic grade quartz is grown commercially by the hydrothermal method. Further, KTP is grown by both flux and hydrothermal methods, and it is widely acknowledged by those familiar with the art that the hydrothermally grown product is generally of superior quality. The hydrothermal method involves the use of superheated water (liquid water heated above its boiling point) under pressure to cause transport of soluble species from a nutrient rich zone to a supersaturated growth zone. Generally, a seed crystal is placed in the growth zone to control the growth and supersaturation is achieved by the use of differential temperature gradients. The superheated fluid is generally contained under pressure, typically 5-30 kpsi, in a metal autoclave. Depending on the chemical demands of the system the autoclave can be lined with a noble metal using either a fixed or floating liner. These general techniques are well known to those of ordinary skill in the art and have been used for the growth of a variety of electro-optic crystals.

SUMMARY OF THE INVENTION

Accordingly, the present invention is directed to a method for growing a periodically poled crystal which includes the steps of: providing a pressure vessel having a growth region and a nutrient region, providing a seed crystal having periodically inverted domains, positioning the seed crystal in the growth region of the pressure vessel, providing a medium comprising a nutrient and a mineralizer in the nutrient region, and heating and pressurizing the vessel such that a growth temperature is produced in the growth region, a nutrient temperature is produced in the nutrient region, and a temperature gradient is produced between the growth region and the nutrient region, whereby growth of the crystal is initiated, the growth temperature ranging from about 375° C. to about 495° C., preferably from about 450° C. to about 475° C., the nutrient temperature ranging from about 495° C. to about 650° C., preferably from about 550° C. to about 575° C., and the pressure ranging from about 3000 psi to about 35000 psi, preferably from about 8000 psi to about 14000 psi. Preferably, the seed crystal is electronically periodically poled.

In a preferred embodiment the seed crystal has two distinct, periodically spaced domains. However, a seed crystal having three or more distinct, periodically spaced domains may also be employed in accordance with the present invention.

Preferably, the crystal grown by the present method is KTP, but a variety of optical crystals may be grown by the present method.

The present invention also is directed to a periodically poled crystal having a depth of greater than 3 mm through which the periodicity extends, made by a process which includes the steps of: providing a pressure vessel having a growth region and a nutrient region, providing a seed crystal having periodically inverted domains, positioning the seed crystal in the growth region of the pressure vessel, providing a medium comprising a nutrient and a mineralizer in the nutrient region, and heating and pressurizing the vessel such that a growth temperature is produced in the growth region, a nutrient temperature is produced in the nutrient region, and a temperature gradient is produced between the growth region and the nutrient region, whereby growth of the crystal is initiated, the growth temperature ranging from about 375° C. to about 495° C., preferably from about 450° C. to about 475° C., the nutrient temperature ranging from about 495° C. to about 650° C., preferably from about 550° C. to about 575° C., and the pressure ranging from about 3000 psi to about 35000 psi, preferably from about 8000 psi to about 14000 psi. Preferably, the seed crystal is electronically periodically poled.

As above, in a preferred embodiment the seed crystal has two distinct, periodically spaced domains. However, a seed crystal having three or more distinct, periodically spaced domains may also be employed in accordance with the present invention.

Preferably, the periodically poled crystal of the present invention is KTP, but a variety of optical crystals are within the scope of the present invention.

Specifically, the present invention is directed to an optical crystal having at least two periodically inverted domains and having a depth of at least about 3 mm, wherein the periodically inverted domains extend through the entire depth of the crystal.

BRIEF DESCRIPTION OF THE FIGURES OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention.

DETAILED DESCRIPTION OF THE PREFERRED EMBODIMENTS

Figure 1:
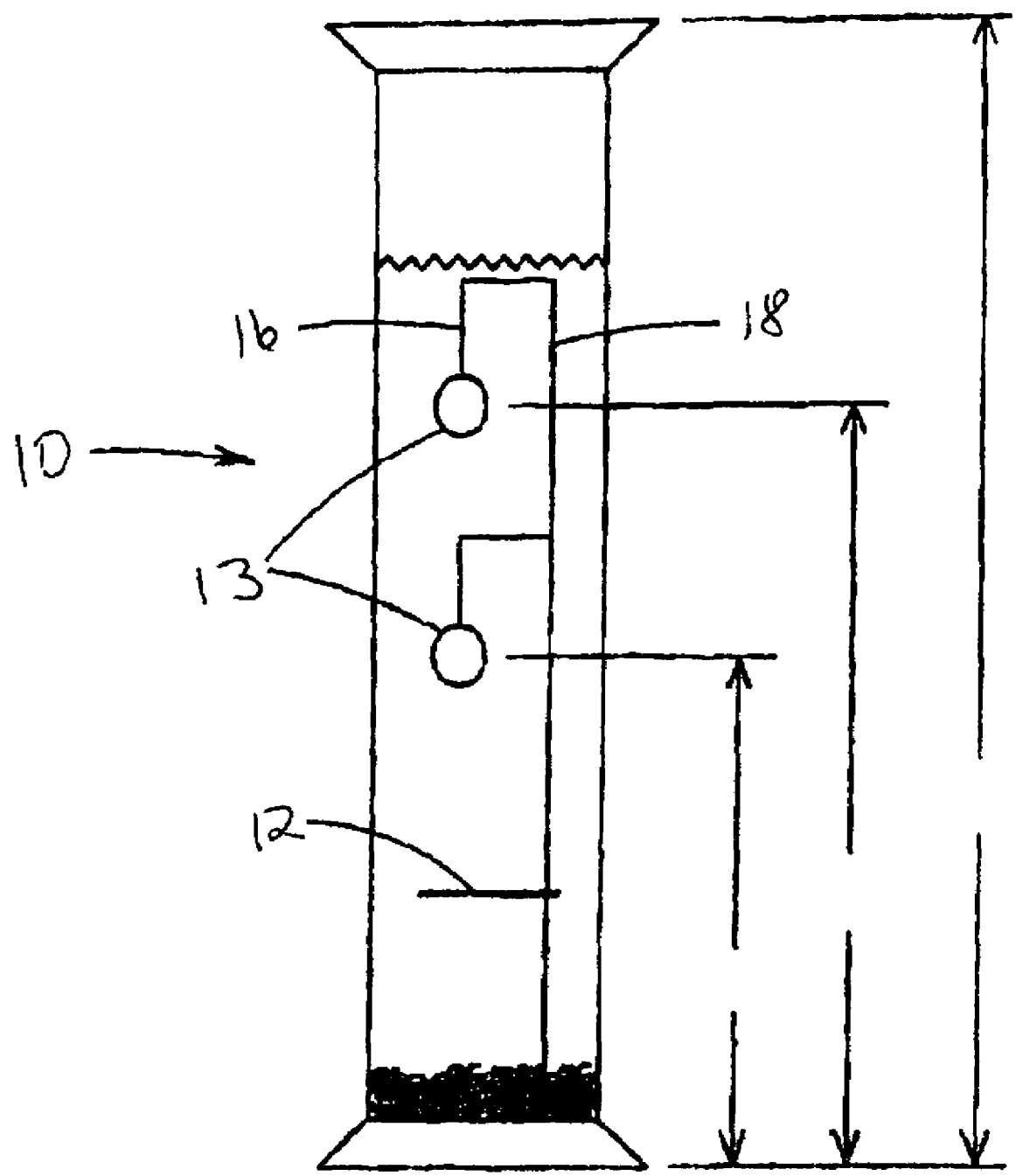
FIG. 1 schematically illustrates a silver tube with seed crystals suspended from a ladder for the growth of larger crystals in accordance with the present invention by a transport growth technique.

The present invention is directed to periodically poled crystals and a hydrothermal growth method for making such crystals. The present crystals are poled throughout their depth and may exceed 5 mm in depth. Specifically, the present inventive crystals are hydrothermally grown from seed crystals having inverted domains. Preferably, the seed crystals have been periodically poled electronically.

Although KTP is preferred, a wide variety of periodically poled crystals may be made in accordance with the present invention. However, in order to grow a particular crystal by the present method the crystal must be capable of being grown hydrothermally, capable of being periodically poled, and have a Curie temperature above its growth temperature. The Curie temperature is the temperature above which a ferromagnetic material loses its permanent magnetism. Thus, the periodic ferroelectric domains are essentially lost and the magnetic properties of the material become random. Thus, among the appropriate crystals for growth as periodically poled crystals in accordance with the present invention are KTP (KTiOPO$_4$), RTP (RbTiOPO$_4$), KTA (KTiOAsO$_4$), RTA (RbTiOAsO$_4$), Rb:KTP (Rb$_{1-x}$K$_x$TiOPO$_4$), Rb:KTA (Rb$_{1-x}$K$_x$TiOAsO$_4$), SBN (Sr$_x$Ba$_{(1-x)}$NS$_2$O$_6$) and Ba$_2$NaNb$_5$O$_{15}$, LiNbO$_3$ and its isomorphs, BaTiO$_3$ and its isomorphs, LiTaO$_3$, KnBO$_3$, KTaO$_3$, NaTaO$_3$, and Pb(Ln)ZrO$_3$, Pb(Ln)Zr(Ti)O$_3$ (PZT and PLZT), ZnO, and ZnS.

An example of an appropriate apparatus for performing the hydrothermal growth transport method is shown in FIG. 1, which shows silver tube 10, preferably of dimensions 1.25 in by 15 in. A silver baffle 12 with 1 or more holes in it is placed 3 in above the bottom of the tube. Two single seed crystals are represented at 13. Holes are drilled in the crystals and they are hung by silver thread 16 on a small silver ladder 18 placed within the tube. In a preferred configuration, the two seed crystals are hung 13 in and 11 in above the bottom of the tube, respectively. Preferably, the nutrient or feedstock and a mineralizer solution is added to the tube and fills about 80% of the remaining volume of the tube. The tube is welded shut and placed in an autoclave with a cold seal and a 1.5 in by 16 in opening. An amount of water sufficient to occupy up to 80% of the remaining free volume is added and the autoclave sealed and placed in a growth station with band heaters affixed to the autoclave. The autoclave is heated in such a way that a temperature gradient is induced. After an extended period of time, the autoclave is cooled, opened and the silver tube opened.

Looking specifically at KTP, a feedstock of K(TiO)(PO$_4$) is prepared via a melt of equal molar KH$_2$PO$_4$ and TiO$_2$. The starting feedstock can be placed in a precious metal floating liner along with a suitable baffle approximately 2 inches above the bottom of the feedstock. A ladder assembly containing periodically poled KTP single crystal seeds is placed in the floating liner. Approximately three-quarters of the remaining space in the container is filled with a mineralizer solution. Typically the mineralizer solution is 1-4M K$_2$HPO$_4$. The liner is sealed and placed in a suitable autoclave that is then counter-pressured so as to compensate for an internal pressure of approximately 8-15,000 psi at temperature, depending on concentration of mineralizer and growth temperature. Typically the growth temperatures for periodically poled KTP boules are 550° C. in the dissolving zone and 475° C. in the growth zone, although the temperatures can vary depending on the desired growth rate and concentration of mineralizer. The thermal gradient is always between 50° and 100°. The highest temperatures should not exceed 700° C. since the Curie point of KTP is 936° C. Under these growth conditions, between 0.3 and 1 mm per side per week of periodically poled KTP can be transported to each patterned seed crystal. The autoclave is maintained at these temperatures and pressures for 6-8 weeks to obtain suitably sized boules with deep ferroelectric domains.

Additional illustrations of the present invention are provided by the following specific examples for KTP and other crystals.

EXAMPLE 1

A feedstock of K(TiO)(PO$_4$) is prepared via a melt of equal molar KH$_2$PO$_4$ and TiO$_2$ at 1200° C. The starting feedstock is placed in a precious metal floating liner along with a suitable baffle approximately 2 inches above the bottom of the feedstock. A ladder assembly containing periodically poled KTP single crystal seeds is placed in the floating liner. Approximately three-quarters of the remaining space in the container is filled with a 2M K$_2$HPO$_4$ mineralizer solution at a pH of 9.5. The liner is sealed and placed in a suitable autoclave that is then counter-pressured so as to compensate for an internal pressure of approximately 12000 psi. The temperature is 550° C. in the nutrient or feedstock zone and 475° C. in the growth zone, although the temperatures will vary somewhat over the course of crystal growth. However, the thermal gradient is always between 50° and 100°. Under these growth conditions, between 0.3 and 1 mm per side per week of periodically poled KTP can be transported to each patterned seed crystal. The autoclave is maintained at these temperatures and pressures for 6-8 weeks to obtain suitably sized boules with deep ferroelectric domains.

EXAMPLE 2

A feedstock of K(TiO)(AsO$_4$) is prepared via a melt of equal molar KH$_2$AsO$_4$ and TiO$_2$ at 1200° C. As in Example 1 above, the starting feedstock is placed in a precious metal floating liner along with a suitable baffle approximately 2 inches above the bottom of the feedstock. A ladder assembly containing periodically poled KTA single crystal seeds is placed in the floating liner. Approximately three-quarters of the remaining space in the container is filled with a 2M K$_2$HAsO$_4$ mineralizer solution at a pH of approximately 9. The liner is sealed and placed in a suitable autoclave that is then counter-pressured as for KTP growth so as to compensate for an internal pressure of approximately 12000 psi. The temperature 550° C. in the nutrient zone and 475° C. in the growth zone, although the temperatures may vary throughout the course of crystal growth. The thermal gradient is always maintained between 50° and 100°. For KTA, the highest temperatures should not exceed 650° C. since the Curie point if KTA is near 850° C. Under these growth conditions, between 0.3 and 1 mm per side per week of periodically poled KTA can be transported to each patterned seed crystal. The autoclave is maintained at these temperatures and pressures for 6-8 weeks to obtain suitably sized boules with deep ferroelectric domains.

EXAMPLE 3

A feedstock of Nb$_2$O$_5$ can be placed in a precious metal floating liner along with a suitable baffle approximately 2 inches above the bottom of the feedstock. Alternatively, a feedstock of LiNbO$_3$ may be employed. A ladder assembly containing periodically poled LiNbO$_3$ single crystal seeds is placed in the floating liner. Approximately three-quarters of the remaining space in the container is filled with a 2M LiOH mineralizer solution. The liner is sealed and placed in a suitable autoclave that is then counter-pressured so as to compensate for an internal pressure of approximately 25,000 psi. The temperatures for periodically poled LiNbO$_3$ boules are 650° C. in the nutrient zone and 550° C. in the growth zone, although the temperatures can vary by 150° depending on the desired growth rate and concentration of mineralizer. The thermal gradient is typically around 100° C. Under these growth conditions, approximately 1.0 mm per side per week of periodically poled $LiNbO_3$ can be transported to each patterned crystal. The autoclave is maintained at these temperatures and pressures for 6-8 weeks to obtain suitably sized boules with deep ferroelectric domains.

Preferred embodiments of the invention have been described using specific terms and devices. The words and terms used are for illustrative purposes only. The words and terms are words and terms of description, rather than of limitation. It is to be understood that changes and variations may be made by those of ordinary skill art without departing from the spirit or scope of the invention, which is set forth in the following claims. In addition it should be understood that aspects of the various embodiments may be interchanged in whole or in part. Therefore, the spirit and scope of the appended claims should not be limited to descriptions and examples herein. Moreover, Applicants hereby disclose all sub-ranges of all ranges disclosed herein. These sub-ranges are also useful in carrying out the present invention.

What is claimed is:

1. A method for growing a periodically poled crystal comprising the steps of:
   providing a pressure vessel having a growth region and a nutrient region;
   providing a seed crystal having periodically inverted domains;
   positioning the seed crystal in the growth region of the pressure vessel;
   providing a medium comprising a nutrient and a mineralizer in the nutrient region; and
   heating and pressurizing the vessel such that a growth temperature is produced in the growth region, a nutrient temperature is produced in the nutrient region, and a temperature gradient is produced between the growth region and the nutrient region, whereby growth of the crystal is initiated, the growth temperature ranging from about 375° C. to about 495° C., the nutrient temperature ranging from about 495° C. to about 650° C., and the pressure ranging from about 3000 psi to about 35000 psi.

2. The method set forth in claim 1 wherein the seed crystal is electronically periodically poled.

3. The method set forth in claim 1 wherein the step of heating and pressurizing the vessel produces a growth temperature ranging from about 450° C. to about 475° C.

4. The method set forth in claim 1 wherein the step of heating and pressurizing the vessel produces a nutrient temperature ranging from about 550° C. to about 575° C.

5. The method set forth in claim 1 wherein the step of heating and pressurizing the vessel produces a pressure ranging from about 8000 psi to about 14000 psi.

6. The method set forth in claim 1 wherein the seed crystal comprises two distinct, periodically spaced domains.

7. The method set forth in claim 1 wherein the seed crystal comprises three distinct, periodically spaced domains.

8. The method set forth in claim 1 wherein the crystal comprises potassium titanyl phosphate.

9. The method set forth in claim 1 wherein the crystal is selected from the group consisting of $RbTiOPO_4$, $KTiOAsO_4$, $RbTiOAsO_4$, $Rb_{1-x}K_xTiOPO_4$, $Rb_{1-x}K_xTiOAsO_4$, $Sr_xBa_{(1-x)}Ns_2O_6$, $Ba_2NaNb_5O_{15}$, $LiNbO_3$ and its isomorphs, $BaTiO_3$ and its isomorpha, $LiTaO_3$, $KnBO_3$, $KTaO_3$, $NaTaO_3$, $Pb(Ln)ZrO_3$, $Pb(Ln)Zr(Ti)O_3$, $ZnO$, and $ZnS$.

10. A periodically poled crystal having a depth of at least 3 mm through which the periodicity extends, made by the process comprising the steps of:
    providing a pressure vessel having a growth region and a nutrient region;
    providing a seed crystal having periodically inverted domains;
    positioning the seed crystal in the growth region of the pressure vessel;
    providing a medium comprising a nutrient and a mineralizer in the nutrient region; and
    heating and pressurizing the vessel such that a growth temperature is produced in the growth region, a nutrient temperature is produced in the nutrient region, and a temperature gradient is produced between the growth region and the nutrient region, whereby growth of the crystal is initiated, the growth temperature ranging from about 375° C. to about 495° C., the nutrient temperature ranging from about 495° C. to about 650° C., and the pressure ranging from about 3000 psi to about 35000 psi.

11. The periodically poled crystal set forth in claim 10 wherein the seed crystal is electronically periodically poled.

12. The periodically poled crystal set forth in claim 10 wherein the step of heating and pressurizing the vessel produces a growth temperature ranging from about 450° C. to about 475° C.

13. The periodically poled crystal set forth in claim 10 wherein the step of heating and pressurizing the vessel produces a nutrient temperature ranging from about 550° C. to about 575° C.

14. The periodically poled crystal set forth in claim 10 wherein the step of heating and pressurizing the vessel produces a pressure ranging from about 8000 psi to about 14000 psi.

15. The periodically poled crystal set forth in claim 10 wherein the seed crystal comprises two distinct, periodically spaced domains.

16. The periodically poled crystal set forth in claim 10 wherein the seed crystal comprises three distinct, periodically spaced domains.

17. The periodically poled crystal set forth in claim 10 wherein the crystal comprises potassium titanyl phosphate.

18. The periodically poled crystal set forth in claim 10 wherein the crystal is selected from the group consisting of $RbTiOPO_4$, $KTiOAsO_4$, $RbTiOAsO_4$, $Rb_{1-x}K_xTiOPO_4$, $Rb_{1-x}K_xTiOAsO_4$, $Sr_xBa_{(1-x)}Ns_2O_6$, $Ba_2NaNb_5O_{15}$, $LiNbO_3$ and its isomorphs, $BaTiO_3$ and its isoxnorph, $LiTaO_3$, $KnBO_3$, $KTaO_3$, $NaTaO_3$, $Pb(Ln)ZrO_3$, $Pb(Ln)Zr(Ti)O_3$, $ZnO$, and $ZnS$.

* * * * *